United States Patent
Olson et al.

(10) Patent No.: US 10,725,117 B2
(45) Date of Patent: Jul. 28, 2020

(54) COMPONENT LEAK DETECTION APPARATUSES AND METHODS

(71) Applicant: Landis+Gyr Technologies, LLC, Pequot Lakes, MN (US)

(72) Inventors: Verne Olson, Pequot Lakes, MN (US); Kevin Reinhart, Ironton, MN (US); Damian Bonicatto, Pequot Lakes, MN (US); Chris Palmer, Breezy Point, MN (US)

(73) Assignee: Landis+Gyr Technologies, LLC, Pequot Lakes, MN (US)

(*) Notice: Subject to any disclaimer, the term of this patent is extended or adjusted under 35 U.S.C. 154(b) by 80 days.

(21) Appl. No.: 15/992,962

(22) Filed: May 30, 2018

(65) Prior Publication Data
US 2019/0369153 A1   Dec. 5, 2019

(51) Int. Cl.
*G01M 3/04* (2006.01)
*G01R 31/50* (2020.01)
*G01M 3/40* (2006.01)
*G01R 31/28* (2006.01)

(52) U.S. Cl.
CPC .............. *G01R 31/50* (2020.01); *G01M 3/40* (2013.01); *G01R 31/2812* (2013.01); *G01R 31/2813* (2013.01)

(58) Field of Classification Search
CPC .. G01R 31/024; G01R 31/025; G01R 31/026; G01R 31/28; G01M 3/04
See application file for complete search history.

(56) References Cited

U.S. PATENT DOCUMENTS

| | | | |
|---|---|---|---|
| 6,639,517 B1* | 10/2003 | Chapman | G01M 3/16 137/312 |
| 2005/0255724 A1* | 11/2005 | Picco | H01R 13/6683 439/77 |
| 2008/0157800 A1* | 7/2008 | Hong | G01R 31/2648 324/762.01 |
| 2010/0302047 A1 | 12/2010 | Wood | |

(Continued)

FOREIGN PATENT DOCUMENTS

| CN | 102095557 A | 6/2011 |
|---|---|---|
| WO | 2017061454 A1 | 4/2017 |

OTHER PUBLICATIONS

PCT Patent Application No. PCT/US2019/033222, International Search Report and Written Opinion, dated Sep. 4, 2019, 11 pages.

(Continued)

*Primary Examiner* — Hoa C Nguyen
(74) *Attorney, Agent, or Firm* — Kilpatrick Townsend & Stockton LLP

(57) ABSTRACT

Aspects of the present disclosure are directed toward detection of leakage from an enclosed component using an apparatus. The apparatus includes a printed circuit board (PCB) including a first conductive trace, a second conductive trace, and sets of terminals electrically connected to the first and second conductive traces configured and arranged to indicate changes in impedance caused by leaked liquid. The respective portions of the first and second conductive traces are interleaved, and configured and arranged to suspend flow of the leaked liquid from an enclosed component, thereby causing a change in impedance between at least one of the sets of terminals.

19 Claims, 3 Drawing Sheets

(56) References Cited

U.S. PATENT DOCUMENTS

| | | | |
|---|---|---|---|
| 2011/0141630 A1 | 6/2011 | Pelc et al. | |
| 2011/0291845 A1* | 12/2011 | Rice | G08B 21/20 |
| | | | 340/605 |
| 2016/0178475 A1* | 6/2016 | Krishnan | G01M 3/16 |
| | | | 324/713 |
| 2017/0138877 A1* | 5/2017 | Otomaru | G01N 27/04 |
| 2017/0227415 A1* | 8/2017 | Jang | G01M 3/16 |
| 2018/0352310 A1 | 12/2018 | Bonicatto | |

OTHER PUBLICATIONS www.vina.co.kr. VinaTech Product Catalogue. "VinaTech Vision for Nature—Hy-Cap/VinaTech Supercapacitor," pp. 1-12 (retrieved Mar. 2018).

* cited by examiner

PCB Sensor Test Definitions 250

| Pin From | Pin To | Pass/Fail Criterion | Test Definition |
|---|---|---|---|
| 1 | 7 | Pass: Impedance < 0.5 ohms | Test for open |
| 2 | 6 | Pass: Impedance < 0.5 ohms | Test for open |
| 3 | 5 | Pass: Impedance < 0.5 ohms | Test for open |
| 1 | 2 | Pass: Impedance > 1 Mohms | Test for short, left outer wall |
| 2 | 3 | Pass: Impedance > 1 Mohms | Test for short, left fingers, positive hole |
| 3,5 | 4 | Pass: Impedance > 1 Mohms | Test for short, left, right, negative hole |
| 5 | 6 | Pass: Impedance > 1 Mohms | Test for short, right fingers, positive hole |
| 6 | 7 | Pass: Impedance > 1 Mohms | Test for short, right, outer wall |
| 2,6 | 8 | Pass: Impedance > 1 Mohms | Test for short, positive hole to back side of board |
| 4 | 8 | Pass: Impedance > 1 Mohms | Test for short, negative hole to back side of board |

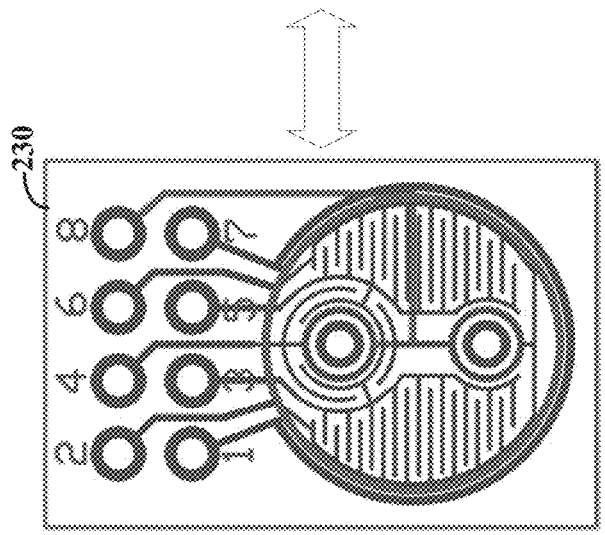

FIG. 2B

COMPONENT LEAK DETECTION APPARATUSES AND METHODS

BACKGROUND

Various types of enclosed devices are designed to store and use liquid. For example, various batteries and/or charge storage devices, such as a supercapacitor, store electrolyte or other liquids which are used to provide power. Such enclosed devices, which are used to provide a particular function, can cause issues due to leaking the liquid, which can cause circuit malfunction. The liquid leaked can flow to portions of a related printed circuit board (PCB) causing circuit malfunction, such as conductions and/or corroding conductive traces.

Aspects of the present disclosure are directed toward methods, apparatuses, or systems for detecting leakage of an enclosed component.

SUMMARY

Aspects of the present disclosure are directed to addressing the above-discussed aspects as well as others which will become apparent based on the detailed description that follows. According to one embodiment of the present disclosure, aspects are directed to detecting leakage of corrosive/conductive liquid from an enclosed component of an apparatus.

In various embodiments, the apparatus includes a printed circuit board (PCB). The PCB has first and second conductive traces, and sets of terminals connected to the first and second traces. The sets of terminals are used to indicate changes in impedance caused by leaked liquid. The changes in impedance include or are associated with opens attributable to corrosion of tracings due to corrosive liquid and/or shorts due to conductive liquid as leaked from an enclosed component. Respective portions of the first and second conductive traces are interleaved and can suspend flow of leaked liquid from an enclosed component, thereby causing a change in impedance between at least one of the sets of terminals. The changes in impedance caused by the leaked liquid can be detected before the open and/or short occurs between the at least one of the set of terminals and with the corrosion/conduction leading to an increasing change in impedance, this change can be referred to as a (partial) change in impedance.

In accordance with one particular embodiment, the apparatus further includes the enclosed component having a housing that contains the corrosive/conductive liquid. The enclosed component can, during operation of the apparatus, use the corrosive/conductive liquid to perform an electrical activity pertinent to a specific configuration of the enclosed component, such as providing power to other circuitry of the apparatus. The enclosed component further includes terminals. The terminals of the enclosed component can secure and connect to the PCB. In such embodiments, the respective portions of the first and second conductive traces that are interleaved can be oriented between the PCB and the terminals of the enclosed component. For example, the PCB can be oriented gravitationally below the enclosed component.

In some specific embodiments, the conductive traces or portions thereof can act as a physical barrier to the leaked liquid. For example, the apparatus can be used to physically trap leaked liquid between the PCB and respective portions of the first and second conductive traces. The respective portions of the first and second conductive traces can be segmented (e.g., fanned, parallel, etc.) on an area of the PCB which overlaps with the terminals of the enclosed component and which can, at least momentarily, trap the leaked liquid between the segmentations sufficiently long to detect the change(s) in impedance. The traces can have a thickness (e.g., a height from the PCB toward the enclosed component) of between 1.5 thousands of an inch and 2.0 thousands of an inch which is used to physically trap the leaked liquid between the PCB and the interleaved pattern. The leaked liquid can be physically trapped sufficiently long to detect the changes in impedance, and in some instances, the conductive traces can direct migration of at least a portion of the leaked liquid across a portion of the PCB. The directed migration can prevent or mitigate contamination of particular portions of the PCB and/or other circuitry components of the apparatus.

Yet other embodiments are directed to an apparatus that includes the above-described PCB, the enclosed component, and a logic circuit. The logic circuit is arranged with the sets of terminals of the PCB to detect the changes in impedance caused by the leaked liquid. As described above, the changes in impedance are associated with leaked liquid that causes partial shorts and/or opens (e.g., are less than an open and/or short). For example, the logic circuit can sense a power parameter (e.g., current or voltage) across the first and/or second conductive traces via respective sets of terminals connected thereto. In some embodiments, the logic circuit can output a signal indicative of leakage of the enclosed component in response to the detected change in impedance. In specific embodiments, the signal is indicative of both the leakage and of shorting or corrosion (or partial shorting or opens) of respective portions of the first and second conductive traces. The signal can be provided in response to detected impedance changes and/or impedance values that are outside a threshold. In various specific embodiments, the logic circuit detects a partial change in impedance associated with corrosion, which is detected before the open occurs between the respective sets of terminals and outputs the signal in response to the detected partial change. In other embodiments and/or in addition, the logic detects a partial change in impedance associated with changing conduction, which is detected before the short occurs between the respective sets of terminals and outputs the signal in response to the detected partial change.

The signal can indicate a region of the PCB associated with the leak and/or a short or open detected. For example, respective terminals of the set of terminals can be associated with different regions of the PCB. The sets can be used to test for leaks at the different regions, such as traces located at the outside wall of the pattern of conductive traces, traces located at the left or right outer wall, traces located at the left or right interleaved fingers, traces located at or proximal to the negative or positive connections or holes to the backside of the PCB.

In a number of specific embodiments, at least a portion of the leaked liquid is ionic polarized. In such embodiments, the respective portions of the first and second conductive trace or sections thereof can at least momentarily trap the leaked liquid by electrically attracting the portion of the leaked liquid. For example, any of the above-described apparatuses can further include a voltage source. The voltage source can be used to apply electrical energy (e.g., a voltage or current) across at least one of the first and second conductive traces via respective sets of terminals connected to the first and/or second conductive traces. The logic circuit can control the voltage source and apply the electrical energy to the respective sets of terminals. The electrical energy can cause the first and/or second conductive traces to electrically attract the at least portion of the leaked liquid.

The above-described apparatus can be used to test for different conditions associated with the leaked liquid. The logic circuit can detect impedance below a threshold (e.g., low impedance) which is indicative of conductive material migrating to the PCB between two traces (e.g., short) and/or detect impedance above another threshold (e.g., high impedance) which is indicative of an open (or near open) circuit between two traces due to corrosive material migrating to the PCB between two traces. In response to the detection, one or more additional (passive or active) actions can occur, as further described below. Additionally, leaked liquid can be contained by the apparatus in one or more ways. For example, the leaked liquid can be trapped by the depth of the PCB traces and/or the geometry of the traces. In other embodiments and/or in addition, charged or ionic leaked liquid can be attracted and held to traces that have an appropriate voltage potential applied (e.g., positive, negative, or ground). Further, the leaked liquid can be trapped through the use of sacrificial traces which neutralizes the liquid.

In various specific aspects, one or more additional actions can occur in response to detecting the change in impedance, partial change in impedance and/or a leak. Such actions can mitigate impacts of the leaked liquid. Example actions are associated with a changed power parameter, or a rate of change of the power parameter of the enclosed component. For example, the logic circuit can passively detect and/or monitor the power parameter and/or actively change the power parameter or rate of change of the power parameter. Example power parameters include a charge voltage (or a charge on a circuit of the enclosed component), current while charging the enclosed component and/or rate or timing of charging and discharging the enclosed component. Additional example actions include monitoring environmental conditions, such as air temperature and/or humidity, and changing the charge voltage (or the charge on a circuit of the enclosed component) responsive to the monitored environmental conditions. In further embodiments and/or in addition to one or more of the above, the enclosed component can be charged with duty cycles pulses below a threshold, with ramping current pulses, and/or discharged when usage is not anticipated to occur (e.g., in a sleep mode).

The above summary is not intended to describe each illustrated embodiment or every implementation of the present disclosure. The figures and detailed description that follow, including that described in the appended claims, more particularly describe some of these embodiments.

BRIEF DESCRIPTION OF FIGURES

Various example embodiments may be more completely understood in consideration of the following detailed description in connection with the accompanying drawings, in which:

FIG. 2B depicts an example printed circuit board and testing methods consistent with embodiments of the present disclosure.

Figure 1:
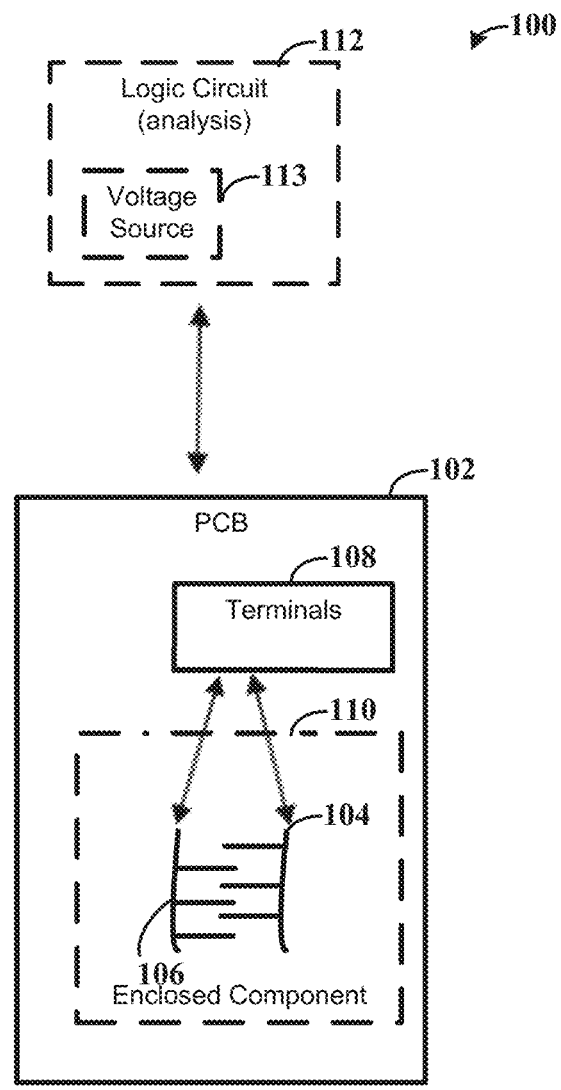
FIG. 1 is a block diagram of an example apparatus in which leakage of an enclosed component is detected, consistent with embodiments of the present disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

DETAILED DESCRIPTION

Aspects of the present disclosure are believed to be applicable to a variety of different types of apparatuses, methods, systems and arrangements, including those that may be implemented for detecting leakage of an enclosed component. In some embodiments, the leakage can be detected prior to an open occurring or malfunctioning of other components of the apparatus. In some more specific embodiments, a power parameter (or rate of change of a power parameter) associated with the enclosed component is monitored and/or changed to prevent or mitigate further damage to circuit components. While the present disclosure is not necessarily limited to such applications, various aspects of the disclosure may be appreciated through a discussion of various examples using these contexts.

According to one embodiment which is consistent with aspects of the present disclosure, a plurality of different communication apparatuses, such as metering devices for assessing utility services (e.g., power line or other type of utility services) can be located at a variety of remote locations. The communication devices communicate with a remotely-situated computer server (e.g., operated under the auspices of the utility company or a third party) over a broadband network, with the broadband network being used by the communication devices to communicate with the remote computer server according to certain schedules or protocols known to the remote server or the utility company. The server can receive from the devices, communications indicative of an operating status of each respective communication device as expected according to the schedules or protocols. In a specific example, in response to receiving and/or not receiving the respective communications from the devices, the server can assess a possible power outage within one or more regions by comparing the received communications and threshold criteria associated with the schedules.

The apparatuses can include an enclosed component which is used to provide power to the apparatus, such as in the event of a power outage. As a specific example, the enclosed component can include a supercapacitor. The enclosed component has a housing that contains a liquid, which may be corrosive and/or conductive. During operation, the liquid is used to perform an electrical activity pertinent to a specific configuration of the enclosed component. In some instances, the liquid may leak from the enclosed component and, depending on the specific chemistry of the leaked liquid, cause circuit malfunction. As the different apparatuses can be located at a variety of remote locations and monitoring the apparatuses for leaks at the site of the apparatus can be difficult. Various embodiment are directed to an apparatus including a printed circuit board (PCB) which is used to detect liquid leaked from an enclosed component. The PCB can include a pattern of traces, such as a first conductive trace and a second conductive trace, which are located gravitationally under terminals of the enclosed component that are used to connect to the PCB. In a specific embodiment, the conductive traces can be gravitationally under a capacitor seal of a supercapacitor (e.g., integral bung, metal rim, and/or rubber or other material). The pattern of traces is used to detect opens attributable to corrosion of traces due to the corrosive leaked liquid, as well as shorts due to conductive leaked liquid, via changes in impedance. The traces are electrically connected to sets of terminals which are used to indicate the changes in impedance. As a specific example, conduction and corrosion can be detected, such as when portions of the pattern have been etched away by the corrosive liquid. In more specific embodiments, a partial change in impedance that is associated with corrosion is detected prior to an open occurring between respective sets of the terminals and a signal can be output that is indicative of the leakage of the enclosed component responsive to the detected partial change in impedance (and before an open occurs). Alternatively and/or in addition, a partial change in impedance that is associated with conductive leaked liquid is detected prior to a short occurring and a signal is output indicative of the leak responsive to the detected partial change in impedance. In further specific embodiments, at least portions of the traces (e.g., sections of the trace pattern) can be energized to attract ionic polarized electrolyte and to trap the leaked liquid before or mitigate contamination of other circuitry of the apparatus.

Consistent with more specific embodiments, the apparatus includes a PCB. The PCB has a first conductive trace and a second conductive trace, with respective portions of the first and second conductive traces being interleaved. The PCB further includes sets of terminals electrically connected to the first and second conductive traces. The terminals are used to indicate changes in impedance, including shorts and opens. In specific implementations, the PCB is positioned proximal to an enclosed component including a housing that contains a corrosive/conductive liquid such that the first and second conductive traces are oriented gravitationally below the terminals of the enclosed component. The respective portions of first and second conductive traces can suspend flow of leaked liquid from the enclosed component, which can cause a change in impendence between at least one of the set of terminals. The change in impedance, depending on the set of terminals and/or the impedance value, can be indicative of a short and/or an open. The enclosed component, as described above, can be susceptible to leakage. For example, the enclosed component can include terminals oriented to connect the PCB. The capacitor seal, which the terminals may be around, can be susceptible to leakage, such as with a supercapacitor.

In connection with the present disclosure, the conductive traces can be used to physically trap liquid between the PCB and the interleaved pattern of respective portions of the first and second conductive traces. For example, the conductive traces can act as physical barriers to the migration of the leaked liquid across the PCB surface. The interleaved pattern can trap the leaked liquid and direct migration of the leaked liquid. The respective portions of the first and second conductive traces are segmented (e.g., fanned, parallel, etc.) on an area of the PCB which overlaps with terminals of the enclosed component, to at least momentarily trap the leaked liquid between the segmentations sufficiently long to detect the changes in impedance. In some specific embodiments, at least a portion of the first and second conductive traces can be arranged in a pattern such that tips or ends of segments of the first and second conductive traces are parallel to one another with spaces between the segments. In such embodiments, the spaces between can be used to detect partial shorts/opens due to changes in distance between the first and second conductive traces caused by leaked material.

In some specific examples, the conductive traces and/or at least the interleaved pattern can include conductive traces having a thickness (e.g., height from the PCB toward the enclosed component) of between 1.5 thousands of an inch and 2.0 thousands of an inch. Such thickness can be used to physically and momentarily trap the leaked liquid between the PCB and the interleaved pattern. The trapping can be sufficiently long to cause the change and/or the partial change in impedance and/or can mitigate or prevent the leaked liquid from damaging other circuit components. In some specific embodiments, the leaked liquid may be or include an ionic polarized liquid which is trapped by electrically attracting the leaked liquid, as further described herein.

In various embodiments, the apparatus includes the above described PCB, enclosed component and a logic circuit. The logic circuit is arranged with the set of terminals to detect the changes and/or the partial changes in impedance. More specifically, the traces run from the interleaved pattern and connect to the logic circuit via various inputs, such as GIPIO and/or A/D inputs. Further, the logic circuit can output a signal indicative of leakage of the enclosed component responsive to the detected changes and/or partial changes in impedance. The signal can be provided, which is indicative of leaking of liquid and/or (partial) shorting or corrosion of the respective portions of the first and second conductive traces, in response to the detected changes in impedance or impedance values outside a threshold (e.g., a partial change). In specific embodiments, respective terminals of the set of terminals can be associated with different regions of the PCB and/or of the first and second conductive traces. For example, the logic circuit can be used to test the different regions for shorts and opens, as further illustrated herein.

In a number of embodiments, the logic circuit can perform various actions responsive to the detected changes and/or partial changes in impedance. The various actions are associated with a changed power parameter and/or a rate of change of the power parameter of the enclosed component. In a first context, the logic circuit can actively change a power parameter and/or a rate of change of the power parameter. In other contexts and/or in addition, the logic circuit can passively detect and/or monitor the power parameter and/or the rate of change of the power parameter, and report the various values of the power parameter as data to external circuitry and/or take further action. Example power parameters and rates of changing the power parameters include a charge voltage or a charge on a circuit of the enclosed component, a current when charging the enclosed component, a rate of discharging the enclosed component, charging with changed duty cycle pulses or ramping current pulses, and timing of when to discharge or charge the enclosed component.

In various more specific embodiments, the logic circuit can reduce a charge voltage or a charge on a circuit of the enclosed component in response to the detected changes and/or partial changes in impedance. Reducing the charge voltage may mitigate and/or prevent additional liquid leakage and/or allow for additional time prior to circuitry failure such that personnel can be dispatched to the apparatus to remove and/or replace the enclosed component. In other embodiments, in response to the detected changes and/or partial changes in impedance, other actions can occur, such as charging at a lower current, discharging at a reduced rate, only charging at temperatures and/or humidity below a threshold and/or changing the charge voltage at particular temperatures and/or humidity values, changing the duty cycle pulses, ramping current pulses, and/or discharging at particular times. As may be appreciated, various embodiments include one or various combinations of the above-described active and passive actions. The specific actions taken can depend on the actual circuitry and/or trace pattern. The various test patterns and actions can be adjusted responsive to different circuitry, trace patterns, and resulting changes in impedance detected. As a specific example, the logic circuit may passively detect the power parameter and/or rate of change of the power parameter in response to detecting a change in impedance above a first threshold. The logic circuit may subsequently actively change a charge voltage in response to detecting another change in impedance above a second threshold that is greater than the first threshold. As a non-limiting example, the first threshold may be associated with a near open (or short) circuit and the second threshold is associated with an open (or short) circuit, although embodiments are not so limited.

In some specific embodiments, the interleaved pattern of conductive traces can include portions which are not connected respectively together. For example, one or more of the traces may not be connected to other trace, and can have a separation (e.g., distance between) from the other traces in the pattern. The distance between the trace and the remaining trace pattern can be adjusted depending on the specific circuitry and/or to refine a sensitivity of the trace pattern to leaked liquid. As a specific example, the distance between the trace and a portion of the remaining trace pattern can be reduced by soldering additional metal to the trace and proximal to the portion of the remaining trace pattern.

As previous described, in some embodiments, portions of the conductive traces can electrically and/or physically attract at least a portion of the leaked liquid. In such embodiments, the apparatus further includes a voltage source which is used to apply electrical energy (e.g., voltage or current) across at least one of the first and second conductive traces via respective sets of terminals connected thereto. The electrical energy applied causes the conductive trace to electrically attract the leaked liquid that is ionically polarized. For example, the enclosed component may contain an ionic polarized electrolyte. A voltage is applied and which is used to trap the leaked ionic polarized electrolyte prior to or in a manner to mitigate contamination of other circuitry. Such traces can act as sacrificial material in such embodiments. Alternatively and/or in addition, the traces can physically attract at least a portion of the leaked liquid and/or neutralize the portion of the leaked liquid.

Turning now to the figures, FIG. 1 is a block diagram of an example apparatus in which leakage of an enclosed component is detected, consistent with embodiments of the present disclosure. Presence of the leak of the enclosed component can be detected using conductive traces on a PCB. More specifically, changes in impedance can be measured that are indicative of a leak of corrosive and/or conductive liquid. The changes in impedance can include shorts, opens, and/or leaks that are detected prior to a short or open occurring depending on the impedance values as measured across particular sets of terminals electrically connected to the conductive traces. Furthermore, the terminals can be associated with different regions of the PCB. In this context and as mentioned previously, aspects of the disclosure can be used to detect leakage of liquid from an enclosed apparatus responsive to the changes in impedance, indicate a (near) short or open, and provide indication of the location of the leaked liquid. As described above, the changes in impedance are associated with the leaked liquid and can cause partial or near shorts and/or opens (e.g., are less than an open and/or short). The detection of the leak can be identified remotely via a signal output, and, in specific embodiments, additional action can occur that is associated with a power parameter or change in power parameter of the enclosed component.

With reference to FIG. 1, the apparatus 100 includes a PCB 102 having a first conductive trace 104 and a second conductive trace 106 that are interleaved. The first and second conductive traces 104, 106 can be electrically connected to sets of terminals 108 that are used to indicate changes in impedance that include opens attributable to corrosion of tracings due to corrosive leaked liquid. In various embodiments, the changes in impedance can also or alternatively include shorts or leaks that occur prior to a short or open occurring that are due to corrosive and/or conductive leaked liquid. The first and second conductive traces 104, 106 can suspend flow of corrosive and/or conductive liquid leaked from an enclosed component 110, which causes a change in impedance between at least one of the sets of terminals 108, which are optional (alternatively, terminals 108 can be circuit access points). Although the embodiment of FIG. 1 illustrates first and second conductive traces, embodiments are not so limited and can include more than two conductive traces. Additionally, the apparatus can include at least one other trace connected to the sets of terminals 108, such as additional traces than illustrated by FIG. 1.

Although not illustrated, the apparatus can be part of a network of a plurality of apparatuses, such as equipment forming part of a power distribution system that includes a utility (power) company which generates the AC power for distribution via various geographically-dispersed distribution stations, for consumption at the facilities of customer sites where respective sets of equipment are located or other types of networks. The different apparatuses can be part of a mesh network, for instances, in which endpoint devices communicate data to mesh concentrator devices. Each apparatus can include an enclosed component that is susceptible to leaking corrosive and/or conducive liquid (herein referred to as leaked liquid), such as a supercapacitor, which is used to provide power to the circuitry. The enclosed component can, during operation, use the liquid to perform an electrical activity, which is pertinent to a specific configuration of the enclosed component. Example enclosed components include a battery and a liquid enclosed capacitor (e.g., supercapacitor, liquid electrolyte, etc.). In some specific embodiments, the supercapacitor is used to provide power when other power sources are lost. The power from the supercapacitor may not be needed for a threshold time, such as two to three or more years. The leaking of the liquid can damage circuitry associated with the apparatus, and, in some instances, cause failure or malfunctioning. Further, as the system can include distributed apparatuses, monitoring the apparatuses for liquid leakage can be time consuming and expensive. Embodiments in accordance with the present disclosure can be used to detect the leak, prevent or mitigate further movement of the leaked liquid (at least momentarily), and provide a signal to indicate the leak. The signal can be sent to a central server and/or to computing circuitry accessible by personal to service the apparatus, and/or can provide a recommendation for maintenance or other actions. For more general and specific teachings directed to mesh networks and endpoint device, reference is made to U.S. patent application Ser. No. 15/615,619, filed Jun. 6, 2017, entitled "Power-Outage-Assessment Apparatuses and Methods," which is incorporated herein in its entirety for its teaching.

For example, the apparatus 100 can physically trap the leaked liquid between the PCB 102 and the interleaved pattern of the first and second conductive traces 104, 106. The leaked liquid can be at least momentarily trapped and sufficiently long to detect the changes in impedance. In specific embodiments, the apparatus 100 physically traps the leaked liquid between the PCB 102 and the interleaved pattern of the respective portions of the first and second conductive traces 104, 106, and directs migration of the leaked liquid across a portion of the PCB 102. For example, the respective portions of the first and second conductive traces are segmented (e.g., fanned, parallel, etc.) on an area of the PCB 102 which overlaps with the terminals of the enclosed component 110, to at least momentarily trap the leaked liquid between the segmentations sufficiently long to detect the changes in impedance, including partial changes.

In various embodiments, the apparatus 100 further includes the enclosed component 110. The enclosed component 110 includes a housing that contains the corrosive/conductive liquid and has terminals that connect to the PCB 102. During operation of the apparatus 100, the enclosed component 110 uses the liquid to perform an electrical activity pertinent to a specific configuration of the enclosed component 110, such as providing power to components of the apparatus 100. The terminals of the enclosed component 110 can be oriented to overlap with the respective portions of the first and second conductive traces 104, 106 that are interleaved. Further, the respective portions are oriented between the PCB 102 and the terminals of the enclosed component 110 can suspend flow of liquid leaked from the housing, thereby causing changes in impedance between at least one of the sets of terminals 108 of the PCB. The PCB 102 can be oriented gravitationally below the enclosed component 110, such that the liquid leaked from the enclosed component 110 may travel towards and come in contact with the first and second conductive traces 104, 106.

According to a number of embodiments, the apparatus 100 further includes a logic circuit 112. The logic circuit 112 is configured and arranged with the sets of terminals 108 to detect the change in impedance and to output a signal indicative of leakage of the enclosed component 110 responsive to the detected change in impedance. The signal can be provided, and which can be indicative of corrosion (and/or shorting) of respective portions of the first and second conductive traces 104, 106 in response to the detect changes in impedance or impedance values across particular sets of terminals 108 being outside a threshold, as further illustrated by the example table of FIG. 2B, which can be used to detect a partial change in impedance associated with corrosion (or conduction) of respective portions of the traces and that is detected before an open (or a short) occurs between respective sets of the terminals. For example, the logic circuit 112 can sense power parameters (e.g., current or voltage) across the first and/or second conductive traces 104, 106 via respective sets of terminals connected thereto, such as sensing a power parameter across the first conductive trace via respective sets of terminals connected to the first conductive trace.

In various specific embodiments, the logic circuit 112 can test different regions of the PCB 102 for leaks. As further illustrated by FIGS. 2A-2B, different respective terminals of the set of terminals 108 can be associated with different regions of the PCB. The logic circuit 112 can test different regions of the PCB 102 by measuring the impedance across different sets of terminals 108 and/or comparing to one or more thresholds. As further illustrated and described herein, the different sets of terminals can be used to test the different regions of the PCB 102 and the pattern of conductive traces. In some specific embodiments, the pattern of the conductive traces 104, 106 can form an outer ring of conductive traces having a diameter that is larger than the enclosed component 110, interleaved fingers that are connected to the outer ring, and interleaved fingers that are concentric to positive and negative holes to the backside of the PCB 102.

In addition to and/or alternatively to physically trapping the liquid leaked, in some embodiments the first and second conductive traces 104, 106 can be energized to attract the leaked liquid before the leaked liquid contaminates other circuitry (or mitigating the same). For example, the first and/or second conductive traces 104, 106, which are located gravitationally below the enclosed component 110, can electrically and/or physically attract, at least momentarily trap, and/or direct migration of the leaked liquid across a portion of the PCB. In such embodiments, the enclosed component 110 can include a corrosive/conductive liquid that is ionic polarized, such as an ionic polarized electrolyte. The conductive traces 104, 106 are energized to electrically attract the leaked liquid and at least momentarily trap the leaked liquid. The conductive traces, or at least a portion thereof, can act as sacrificial material. For example, the apparatus can further include a voltage source 113, which may form part of the logic circuit 112, although embodiments are not so limited and the voltage source 113 may be separate from the logic circuit 112 and/or form part of the PCB 102. The logic circuit 112 can use the voltage source 113 to apply electrical energy (e.g., voltage or current) across the first and/or second conductive traces 104, 106 via respective sets of terminals 108 connected thereto, and which causes the first and/or second conductive traces to electrically attract the leaked liquid that is ionic polarized. In some embodiments, the leaked liquid can be electrically attracted and can migrate against gravity and/or can migrate from 1.5 thousands of an inch to 2.0 thousands of an inch or more, although embodiments are not so limited.

Alternatively and/or in addition, the traces can physically attract at least a portion of the leaked liquid and/or neutralize the portion of the leaked liquid. For example, at least a portion of the trace pattern can have a voltage potential applied thereon by the logic circuit 112. The voltage potential is set to attract and hold charged or ionic leaked liquid. The voltage potential can be a positive voltage, a negative voltage, or ground depending on the particular charged or ionic leaked liquid. In other embodiments and/or in addition, a portion of the trace pattern can include sacrificial traces which neutralizes the liquid leaked, such as leaked corrosive liquid. The sacrificial traces can be wider than other portions of the trace pattern.

As described above, the logic circuit 112 can output the signal indicative of the leak. The signal can be provided to remotely located circuitry, such as server circuitry accessible by personnel responsible for maintains of the apparatus 100. The signal can indicate a potential leak, the location of the leak, and/or whether (partial) shorting or corrosion of the PCB 102 is occurring, and/or whether an (partial) open of the PCB is occurring. In some specific embodiments, the logic circuit 112 can additionally or alternatively, reduce a charge voltage or a charge on a circuit on the enclosed component 110 in response to the detected changes and/or partial changes in impedance. The reduction in the charge voltage on the enclosed component 110 can increase the time before the leaked liquid causes an open or short and/or circuit malfunction as compared to not reducing the voltage and/or can mitigate further leaking of liquid in some embodiments. Other embodiments, as further described herein, can include charging at a reduced current, discharging at a reduced rate, only charging at particular temperatures and/or humidity, reducing the charge voltage at particular temperatures and/or humidity, charging with particular duty cycle pulses and/or ramping current pulses and/or discharging when usage is not anticipated.

Figure 2A:
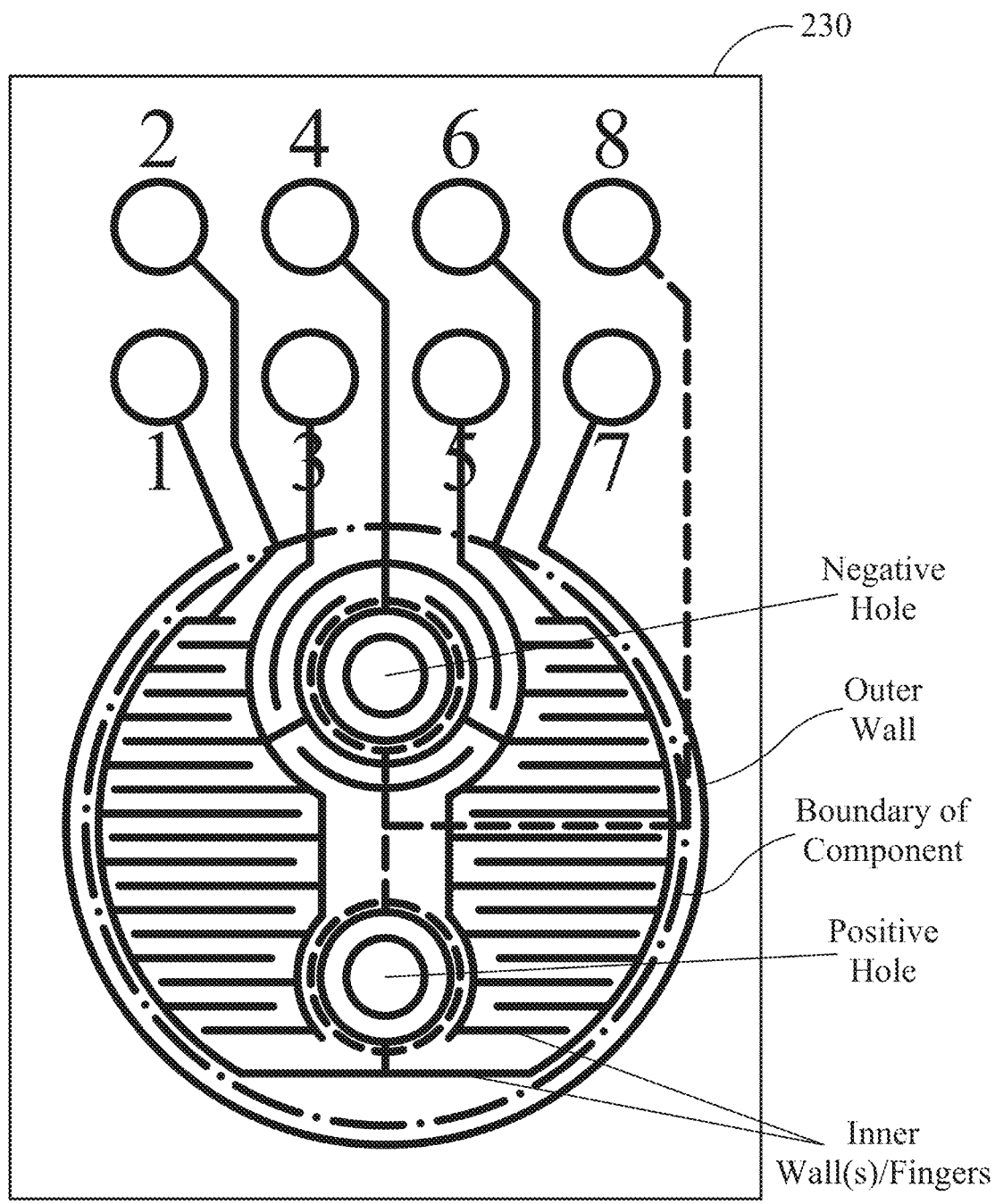
FIG. 2A further depicts a block diagram of an example printed circuit board of an apparatus, consistent with embodiments of the present disclosure.

Also according to aspects of the present disclosure, FIG. 2A depicts a block diagram of an example PCB 230 of an apparatus, consistent with embodiments of the present disclosure. As previously described, the PCB 230 includes first and second conductive traces (e.g., the pattern of traces) and sets of terminals, e.g., 1-8, that are electrically connected to the first and second conductive traces and used to indicated changes in impedance including shorts and opens, such as opens attributable to corrosion of tracings due to corrosive leaked liquid or shorts attributable to conduction between tracings due to conductive leaked liquid.

As illustrated, the pattern of the conductive traces can form an outer ring of conductive traces having a diameter that is larger than the enclosed component and/or larger than the area of the terminals of the enclosed component. The pattern additionally includes one or more interleaved conductive traces. For example, the pattern of interleaved conductive traces can include interleaved fingers that are connected to the inner ring and/or outer ring, and interleaved fingers that are concentric to positive and negative holes to the backside of the PCB. Accordingly, the respective portions of the first and second conductive traces that are interleaved can be segmented (e.g., fanned, parallel, etc.) on an area of the PCB and can at least momentarily trap the leaked liquid between the segmentations sufficiently long to detect changes in impedance.

FIG. 2B depicts the PCB 230 illustrated by FIG. 2A and testing methods consistent with embodiments of the present disclosure with embodiments of the present disclosure. As previously described and illustrated by FIGS. 2A-2B different terminals can be associated with (e.g., electrically connected to) different regions of the PCB 230 and, more specifically, different regions of the pattern of conductive traces. A logic circuit can be electrically connected to the sets of terminals, e.g., terminals 1-8, to detect changes in impedance, and output a signal in response thereto. While many examples are available, the table 250 illustrates an example set of test definitions which can be used by the logic circuit to test for liquid leakage. More specifically, the test definition may identify the location of the leak and/or whether shorting or corrosion occurs (or conduction or an open may be about to occur). The test definitions can provide a threshold impedance value for passing or failing a test of the conductive trace pattern for corrosion (e.g., increases in impedance up to being open) or shorting (e.g., decreases in impedance up to being shorted), and can indicate which portion of the conductive trace pattern is being tested. As may be appreciated by one of ordinary skill, embodiments are not limited to the specific test definitions and/or the conductive trace pattern as illustrated by FIGS. 2A-2B. Rather, FIGS. 2A-2B are provided as an example of a specific implementation.

As illustrated by FIG. 2B, particular sets of terminals can be electrically connected to different portions of the pattern of conductive traces. For example, terminals 1 and 7 can be electrically connected to the outer ring of the conductive trace pattern, which exhibits a greater diameter than the electronic component. Terminals 2 and 6 can be connected to an inner ring of the conductive trace pattern that has interleaved fingers and can include conductive trace that is concentric to the positive hole to the backside of the PCB 230. The inner ring can have a dimension that is less than the dimension of the outer ring and the enclosed component but greater than the positive and negative holes. The interleaved fingers, in some embodiments, can be interleaved with conductive traces connected to terminals 3 and 5. Terminals 3 and 5 can be connected to a conductive trace pattern with interleaved fingers. More specifically, the fingers can interleave with the interleaved fingers connected to terminals 2 and 6 and interleaved fingers connected to terminal 4 and/or the trace patterns that are concentric to the negative and positive holes to the backside of the PCB 230. Terminal 4 can be connected to a conductive trace pattern that is concentric to the negative hole to the backside of the PCB 230. Terminal 8 can be connected to a conductive trace pattern that has portions concentric to both the positive and negative holes. For example, the conductive trace pattern connected to terminal 8 can include rings having a diameter that is greater than the positive and negative holes and greater than the other conductive traces that are concentric to the holes.

The sets of terminals can be used to test for leakage, as well as changes in impedance up to opens and/or shorts. As may be appreciated, changes in impedance toward or up to an open can include increases in impedance, such as an impedance changing from 1,000 ohms to 10,000 ohms (or more). Changes in impedance toward or up to shorting can include decreases in impedance, such as an impedance changing from 10,000 ohms to 1,000 ohms (or less). The above scale is provided for illustrative purposes and is not intended to limit the specification. As a specific example, an impedance value between pin 1 to pin 7 that is greater than 1.0 Mohms can indicate corrosion, e.g., the portion of the conductive trace pattern is open. In such an example implementation, the impedance value between pin 1 to pin 7 can indicate the portion of the conductive trace is not open (or near open). Similarly, an impedance value between pins 2 and 6 can be used to test for corrosion of the inner wall and/or fingers, and between pins 3 and 5 for corrosion of the fingers and/or traces concentric to the holes to the backside of the PCB. As an example of testing for shorting, an impedance value between pin 1 and 2 can be used to test for shorting between the left outer ring and the left inner ring (e.g., based on the threshold 1 Mohms). Similarly, an impedance value between pins 2 and 3 can be used to test for shorting between the left interleaved fingers and the conductive traces that are concentric to the positive hole. An impedance value between pins 3 and 4 or pins 5 and 4 can be used to test for shorting between the left or right interleaved fingers and the conductive traces concentric to the negative hole. An impedance value between pins 5 and 6 can be used to test for shorting between the right interleaved fingers and the conductive traces concentric to the positive hole. An impedance value between pins 6 and 7 can be used to test for shorting between the right outer ring and right inner ring. An impedance value between pins 3 and 4 or pins 2 and 3 can be used to test for shorting between the left or right interleaved fingers/inner ring and the conductive traces concentric to the positive hole. An impedance value between pins 4 and 8 can be used to test for shorting of conductive traces concentric to the negative hole to the backside of the PCB 230. However, the impedance values that indicate passing and failing are not so limited and can include a variety of different values, such as 10-100 kOhms. Additionally, as described above, the logic circuit can test for partial impedance changes which may indicate leakage of liquid, but which may occur prior to an open or short occurring.

In some specific embodiments, the logic circuit can test the different pins and can grade the resulting impedance values on a scale. For example, the logic circuit can produce a score for each region of the plurality of different regions which indicate a probability of a leakage occurring, The scores may be based on the changes in impedance and/or a comparison to one or more thresholds, such as the testing pass/fail criterion illustrated by FIG. 2B. In some embodiments, multiple thresholds may be used and which can indicate a leakage has occurred, which is detected prior to the shorting or open occurring or after occurring.

The above-described apparatus can be used to test for different conditions associated with leaked liquid and/or can contain the leaked liquid. For example, the logic circuit can detect impedance below a threshold (e.g., low impedance) which is indicative of leaked conductive material migrating between two traces (e.g., short) and/or detect impedance above another threshold (e.g., high impedance) which is indicative of an open (or near open) circuit between two traces caused by leaked corrosive material. Leaked liquid can be contained by the apparatus in one or more ways. The leaked liquid can be trapped by the depth of the PCB traces and/or the geometry of the traces. In other embodiments and/or in addition, charged or ionic leaked liquid can be attracted and held to traces that have an appropriate voltage potential applied (e.g., positive, negative, or ground). Further, the corrosive leaked liquid can be trapped through the use of sacrificial traces which neutralizes the corrosive leaked liquid.

As a specific example, the logic circuit can control the lines going into the conductive trace pattern. Using the above example illustrated by FIG. 2B, the logic circuit controls the eight lines going into the terminals 1-8. Any of the terminals 1-8 can be read, by the logic circuit, digitally or in an analog manner using an analog to digital circuit. For instance, using the terminals illustrated by the table 250 of FIG. 2B, an impedance below a threshold (which is due to conductive leaked liquid migrating between two traces) can be detected by the logic circuit using terminals 2 and 3 and/or terminals 5 and 6. An impedance above a threshold between two traces, which is indicative of an open or near open circuit (which is due to corrosive leaked liquid), can be detected by the logic circuit using terminals 2 and 6, and/or 3 and 5. However, embodiments are not so limited and the above is provided as an illustrative example. In the above-provided specific example, the traces ending at terminals 2 and 7 can be sacrificial traces that are wider than other portions of the trace. Additionally, the logic circuit can apply a voltage potential to any portion of the trace pattern to attract leaked liquid for liquid containment purposes.

Similarly, for a multi-layer PCB having traces on one side, leaked liquid issues associated with conductive traces involving at least one inner-board trace can be detected in the same manner (e.g., via terminals 1-8 and/or terminals 108 illustrated by FIG. 1). As a specific example, such PCB material uses, as its dielectric, an epoxy-type resistive material and/or fiber glass, such as FR-4 material, which is known to absorb liquid. Accordingly, detection between PCB layers is appropriate.

In some specific embodiments, the logic circuit sets any of the terminals to a positive voltage or ground, or another secondary circuit can set any of the terminals to a negative voltage. The logic circuit can cycle through the different tests for leakage, corrosion and/or shorting, which can include periodically changing the voltage potentials to test for the change or partial change in impedance. For example, the logic circuit can set all traces to a positive voltage, such as +3.3V, and then periodically change the voltage setting to detect an open (or near open) and/or shorted (or near shorted) circuit and/or impedance outside a threshold, such as the example test illustrated by FIG. 2B. After testing, the logic circuit can set all the traces back to the positive voltage to attract leaked liquid.

As another specific example and/or in addition, the logic circuit can use a pair of terminals to send an analog signal and detect if the analog signal crosses two non-contacting areas, e.g., is near a short. If a near short is occurring, a resulting frequency can occur that is above a threshold. The logic circuit can test for a near short, for example, by sending the analog signal using the pair of terminals and detecting if the analog crosses two non-contacting areas responsive to a frequency. If the frequency is above a threshold indicative of an acceptable norm, a near short can be detected. A frequency above the norm threshold can indicate that that the terminals are too close (e.g., near short). More specifically, the test may include increasing or changing the frequency of the analog signal relative to a threshold of an acceptable norm (e.g., no near short) and an unacceptable condition (e.g., near short) in which a signal of a frequency above a threshold is known to indicate that the terminals are too close.

In various embodiments, the above described apparatuses, as illustrated by FIGS. 1-2B can be used to perform various methods for detecting leakage of liquid from the enclosed components and methods for testing different regions of the PCB for indications of detected leaked. In response to a detected leak, partial change in impedance and/or change in impedance, one or more additional actions can occur for mitigating the leak, which can be controlled by the logic circuit. As previously described, the logic circuit can perform an action associated with a changed power parameter, or a rate of change of the power parameter. Such actions can include actively changing the power parameter or a rate of change of the power parameter and/or passively detecting and/or monitoring the power parameter and rate of change thereof. As specific examples, a charge voltage of the enclosed component can be reduced, the enclosed component can be charged at a reduced current (e.g., trickle charge), and/or a rate of discharge can be reduced. In other embodiments and/or in addition, charging of the enclosed component can change or otherwise be impacted by various environmental conditions, such as air temperature and/or humidity. As further specific examples, charging can occur only when the temperature is below a threshold (e.g., at night or other times in which the temperate is below the threshold), the charge voltage can be reduced when the temperature is above a threshold, charging only occurs when the humidity is below a threshold, and/or the charge voltage is lowered when the humidity is above a threshold. In such embodiments, the apparatus can further include or be in communication with one or more sensor circuits that monitor the temperature and/or humidity. In further embodiments and/or in addition to one or more of the above examples, the enclosed component can be charged with duty cycles pulses below a threshold (e.g., low duty cycle pulses), with ramping current pulses, and/or discharged when usage is not anticipated to occur (e.g., sleeping). Each of the above threshold can be a variety of different values, in various embodiments.

The logic circuit can additionally and/or alternatively communicate with external circuitry responsive to the detected impedance change, partial change, and/or leak. The external circuitry may be associated with a command center and accessible by users. The communication can include data indicative of a status of the enclosed component, such as indicating a potential leak and/or actions that occur in response to the same (e.g., changes in charge voltage, current, discharge, etc.) In some embodiments, the logic circuit can track, store and/or communicate various other information associated with the detected impedance change, leak, and/or power parameters. The other information can include logging the time and/or date, temperature, humidity, voltage, power parameters of the enclosed component (or rate of change) and/or impedance at the time of the leak detection.

Unless otherwise indicated, various general purpose systems and/or logic circuitry may be used with programs in accordance with the teachings herein, or it may prove convenient to construct a more specialized apparatus to perform the required method. For example, according to the present disclosure, one or more of the methods can be implemented in hardwired circuitry by programming a general-purpose processor, other fully or semi-programmable logic circuitry, and/or by a combination of such hardware and a general-purpose processor configured with software and/or data. As another example, it will be appreciated that the term "communication devices" refers to and/or includes circuits enabled to communicate other devices, for example over the illustrated broadband network, such as WiFi and/or cellular enabled devices such as smart thermostats, smart water heaters and the like. For example, WiFi/cellular enabled devices may include a desktop CPU, tablet, smart phone, etc. Accordingly, the various components and processes shown in the figures can be implemented in a variety of circuit-based forms, such as through the use of data processing circuits (operative by circuit components alone or in combination with configuration/software data, otherwise known as "logic circuit(ry)" and/or "modules"). It will also be appreciated that in the above context, such (leaked) liquid includes a variety of material types and forms (e.g., variety of substances exhibiting different viscosities).

It is recognized that aspects of the disclosure can be practiced with computer/processor-based system configurations other than those expressly described herein. The required structure for a variety of these systems and circuits would be apparent from the intended application and the above description.

In certain embodiments, machine-executable instructions are stored for execution in a manner consistent with one or more of the methods of the present disclosure. The instructions can be used to cause a general-purpose or special-purpose processor that is programmed with the instructions to perform the steps of the methods. The steps may be performed by specific hardware components that contain hardwired logic for performing the steps, or by any combination of programmed computer components and custom hardware components.

In some embodiments, aspects of the present disclosure may be provided as a computer program product, which may include a machine or computer-readable medium having stored thereon instructions which may be used to program a computer (or other electronic devices) to perform a process according to the present disclosure. Accordingly, the computer-readable medium includes any type of media/machine-readable medium suitable for storing electronic instructions.

The various embodiments described above are provided by way of illustration and should not be construed to necessarily limit the disclosure. Based on the above discussion and illustrations, those skilled in the art will readily recognize that various modifications and changes may be made to the present disclosure without strictly following the exemplary embodiments and applications illustrated and described herein. For instance, such changes may include variations on particular circuits and/or software code to implement one or more of the various modules. Such modifications and changes do not depart from the true spirit and scope of the present disclosure, including aspects set forth in the following claims.

What is claimed is:

1. An apparatus comprising
a printed circuit board (PCB) including:
a first conductive trace,
a second conductive trace, and
sets of terminals electrically connected to the first and second conductive traces and configured and arranged to indicate changes in impedance caused by leaked liquid; and
wherein respective portions of the first and second conductive traces are interleaved, and configured and arranged to suspend flow of the leaked liquid as leaked from an enclosed component, thereby causing a change in impedance between at least one of the sets of terminals,
wherein a section of the first conductive trace or the second conductive trace includes a sacrificial trace configured and arranged to neutralize corrosive leaked liquid.

2. The apparatus of claim 1, further including a logic circuit configured and arranged with the sets of terminals to detect a partial change in impedance caused by the leaked liquid and that is detected before an open or short occurs between the at least one of the sets of terminals and to output a signal indicative of leakage of the enclosed component responsive to the detected partial change in impedance.

3. The apparatus of claim 1, wherein a second section of the first conductive trace or second conductive trace is configured and arranged to physically attract the leaked liquid.

4. The apparatus of claim 1, further including the enclosed component including:
a housing configured and arranged to contain the liquid, and
terminals configured and arranged to secure to the PCB and oriented to connect to the PCB.

5. The apparatus of claim 1, further including the enclosed component including a housing configured and arranged to contain the liquid, the PCB being oriented gravitationally below the enclosed component.

6. The apparatus of claim 1, the apparatus being configured and arranged to physically trap the leaked liquid between the PCB and the interleaved pattern of the respective portions of the first and second conductive traces.

7. The apparatus of claim 1, wherein a portion of the leaked liquid is ionic polarized and the portions of the first and second conductive traces are configured and arranged to momentarily trap the portion of the leaked liquid by electrically attracting the ionic polarized portion of the leaked liquid.

8. An apparatus comprising:
a printed circuit board (PCB) including a first conductive trace, a second conductive trace, and sets of terminals electrically connected to the first and second conductive traces and configured and arranged to indicate changes in impedance caused by leaked liquid;
an enclosed component including a housing configured and arranged to contain liquid, and terminals of the enclosed component that are configured and arranged to secure to the PCB and are oriented to connect the PCB wherein respective portions of the first and second conductive traces are interleaved, the respective portions being oriented between the PCB and the terminals of the enclosed component and configured and arranged to suspend flow of the leaked liquid as leaked from the housing, thereby causing changes in impedance between at least one of the sets of terminals;

a logic circuit configured and arranged with the sets of terminals to detect the changes in impedance and to output a signal indicative of leakage of the enclosed component responsive to the detected changes in impedance; and a voltage source, wherein the logic circuit and the voltage source are configured and arranged to apply electrical energy across the first conductive trace, thereby causing the first conductive trace to electrically attract at least a portion of the leaked liquid.

9. The apparatus of claim 8, further including at least one other trace connected to the sets of terminals.

10. The apparatus of claim 8, wherein the respective portions of the first and second conductive traces are segmented, on an area of the PCB which overlaps with the enclosed component, to at least momentarily trap the leaked liquid between the segmentations sufficiently long to detect the changes in impedance.

11. The apparatus of claim 8, wherein the enclosed component is configured and arranged to, during operation of the apparatus, use the liquid to perform an electrical activity pertinent to a specific configuration of the enclosed component.

12. The apparatus of claim 8, wherein the logic circuit is configured and arranged to sense a power parameter across the first conductive trace via respective sets of terminals connected to the first conductive trace.

13. An apparatus comprising:

a printed circuit board (PCB) including a first conductive trace, a second conductive trace, and sets of terminals electrically connected to the first and second conductive traces and configured and arranged to indicate changes in impedance caused by leaked liquid;

an enclosed component including a housing configured and arranged to contain liquid, and terminals of the enclosed component configured and arranged to secure to the PCB and are oriented to connect the PCB;

wherein respective portions of the first and second conductive traces are interleaved, the respective portions being oriented between the PCB and the terminals of the enclosed component and configured and arranged to suspend flow of leaked liquid as leaked from the housing, thereby causing changes in impedance between at least one of the sets of terminals; and a logic circuit configured and arranged with the sets of terminals to detect a partial change in impedance caused by the leaked liquid and before an open or short occurs between the at least one of the sets of terminals, and to output a signal indicative of leakage of the enclosed component responsive to the detected partial change in impedance, wherein the logic circuit is further configured and arranged to apply a voltage potential to at least a selected portion of the first conductive trace, periodically change the voltage potential to test for the partial change in impedance and reapply the voltage potential to at least the selected portion to attract the leaked liquid.

14. The apparatus of claim 13, wherein a portion of the leaked liquid is ionic polarized and the apparatus further includes a voltage source, wherein the logic circuit and the voltage source are configured and arranged to apply electrical energy across the selected portion of the first conductive trace via respective sets of terminals connected to the first conductive trace, thereby causing the first conductive trace to electrically attract the portion of the leaked liquid.

15. The apparatus of claim 13, wherein the interleaved pattern of the respective portions of the first and second conductive traces include traces having a thickness of between 1.5 thousands of an inch and 2.0 thousands of an inch, and are configured and arranged to momentarily trap the leaked liquid by physically trapping the leaked liquid between the PCB and the interleaved pattern.

16. The apparatus of claim 13, wherein the first and second conductive traces are located gravitationally below the enclosed component, and the first conductive trace is configured and arranged to momentarily trap the leaked liquid by electrically attracting and directing migration of the leaked liquid across a portion of the PCB.

17. The apparatus of claim 13, wherein the logic circuit is configured and arranged to detect or change a power parameter or a rate of change of the power parameter in response to the detected partial change in impedance.

18. The apparatus of claim 17, wherein the power parameter or rate of change of the power parameter includes a parameter selected from the group consisting of: a charge voltage of the enclosed component, a current while charging the enclosed component, a rate of charging the enclosed component, a rate of discharging the enclosed component, timing of charging the enclosed component, timing of discharging the enclosed component, charging with changed duty cycle pulses, charging with ramping current pulses, and combinations thereof.

19. The apparatus of claim 13, wherein the logic circuit is further configured and arranged to store information associated with the detected partial change in impedance, the information being selected from the group consisting of: a time, a date, temperature, humidity, voltage, impedance at a time of the detected changes in impedance, a power parameter, rate of change of a power parameter and combinations thereof.

* * * * *